United States Patent [19]
Komori

[11] Patent Number: 6,068,964
[45] Date of Patent: May 30, 2000

[54] METHOD FOR PATTERNING AN INSULATOR FILM AND INSTALLING A GROUNDING PIN THROUGH ELECTRON BEAM IRRADIATION

[75] Inventor: Motofumi Komori, Tokyo, Japan

[73] Assignee: NEC Corporation, Japan

[21] Appl. No.: 09/191,582

[22] Filed: Nov. 13, 1998

[30] Foreign Application Priority Data

Nov. 13, 1997 [JP] Japan .................................. 9-312181

[51] Int. Cl.⁷ ...................................................... G03C 5/00
[52] U.S. Cl. ............................................................ 430/296
[58] Field of Search ............................................. 430/296

[56] References Cited

U.S. PATENT DOCUMENTS 5,091,285  2/1992  Watanabe et al. ...................... 430/296
5,288,368  2/1994  De Marco et al. ...................... 430/296

FOREIGN PATENT DOCUMENTS 61-104617  5/1986  Japan .
1-220441   9/1989  Japan .
2-31416    2/1990  Japan .
2-174216   7/1990  Japan .
2-276237   11/1990 Japan .

*Primary Examiner*—Christopher G. Young

[57] ABSTRACT

A process for patterning an insulator film formed on a semiconductor substrate forms contact holes in the insulator film and also exposes a portion of the semiconductor substrate. The exposed portion is used for grounding the substrate during an electron beam irradiation step to an overlying insulator film for preventing the charge-up of the interface between the insulator film and the substrate.

4 Claims, 3 Drawing Sheets

METHOD FOR PATTERNING AN INSULATOR FILM AND INSTALLING A GROUNDING PIN THROUGH ELECTRON BEAM IRRADIATION

BACKGROUND OF THE INVENTION (a) Field of the Invention

The present invention relates to a method for patterning an insulator film by a direct writing technique using electron beam irradiation and, more particularly, to a method for patterning an insulator film while effectively preventing charge-up by electrons during the direct writing step using the electron beam irradiation.

(b) Description of the Related Art

Exposure processes in the fabrication of a semiconductor device are categorized roughly into two groups including a pattern transfer technique wherein a pattern formed on a mask is transferred onto a photoresist film by using light or X-Rays, and a direct writing technique wherein a pattern is directly written based on a design onto a resist film by using an electron beam.

In the direct writing technique, if grounding of the wafer or substrate is incomplete during irradiation of the electron beam onto an insulator film on the wafer, a charge-up of electrons occurs wherein electrons are accumulated on the interface between the wafer and the insulator film. The charge-up causes deflection of the electron beam during the irradiation thereof to deform the resultant pattern, which impedes the direct writing technique from providing a fine pattern.

FIG. 1 shows a conventional technique for grounding a wafer during the direct writing process using an electron beam. The wafer 11 is grounded by thrusting a grounding pin 17 having a sharp tip onto the wafer 11 with a moderate force that allows the grounding pin 17 to penetrate a resist film 13 and an insulation film ($SiO_2$ film) 12 and to contact with the wafer 11 without causing any dust around the wafer. However, in a semiconductor device having multi-level interconnect layers, it is difficult to assure a complete grounding of the wafer by the grounding pin 17 during patterning of a top insulator layer, thereby being unable to effectively suppress the problem charge-up.

Patent Publication JP-A-1-220441 proposes an improved direct writing technique which suppresses the charge-up in a multi-level interconnection structure of a semiconductor device. In the proposal, a portion of the underlying insulator layers at which the grounding pin is to penetrate the insulator layers is selectively removed by a photolithographic technique using a first resist film before forming a second resist film through which the grounding pin penetrates to contact the substrate during patterning a top insulator film. This technique allows easy penetration by the grounding pin for contact with the substrate.

The proposed direct writing technique, however, uses the step of removing the portion of the underlying layers as an additional step, which decreases the throughput of the direct writing.

SUMMARY OF THE INVENTION

In view of the above, it is an object of the present invention to provide a direct writing process for patterning, which is capable of effectively suppressing the charge-up by electrons substantially without increasing the number of process steps and decreasing the throughput of the direct writing process.

The present invention provides a method for forming a semiconductor device comprising the steps of forming an insulator film on a semiconductor substrate, patterning the insulator film by irradiating an electron beam to form contact holes in the insulator film, the patterning exposing a first portion of the semiconductor substrate, and installing a grounding pin on the first portion of the semiconductor substrate.

In accordance with the method of the present invention, the removal of the insulator film for exposing the first portion of the substrate at which the grounding pin is installed is conducted together with the step of patterning the insulator film for forming contact holes therein. Accordingly, increase of the number of process steps or reduction of the throughput of the fabrication process can be avoided.

The above and other objects, features and advantages of the present invention will be more apparent from the following description, referring to the accompanying drawings.

PREFERRED EMBODIMENTS OF THE INVENTION

Figure 1:
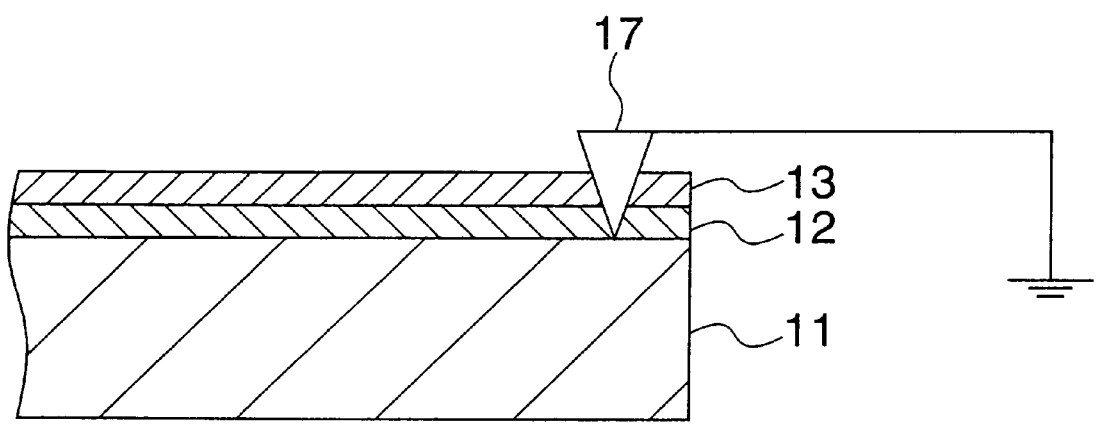
FIG. 1 is a sectional view of a wafer during a conventional direct writing process for patterning.

Now, the present invention is more specifically described with reference to the accompanying drawings, wherein similar constituent elements are designated by similar reference numerals.

Figure 2A:
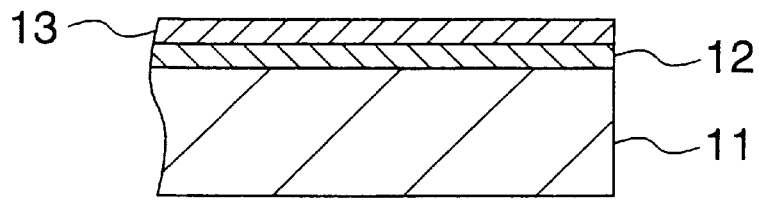
FIGS. 2A to 2D are sectional views of a wafer for showing consecutive steps in a direct writing process therefor according to a first embodiment of the present invention.

Referring to FIGS. 2A to 2D, there is shown a direct writing process according to a first embodiment of the present invention. In FIG. 2A, an insulator film 12 is formed on a wafer (semiconductor substrate) 11 by using a known process, followed by application of a liquid of positive type chemical sensitization resist to form a positive resist film 13.

Subsequently, the resultant wafer 11 is received in a chamber for electron beam direct writing, where the wafer is subjected to patterning of the resist film 13 by electron beam 10 for obtaining a desired pattern for the semiconductor device including contact holes. The patterning for the contact holes also removes a portion 13a of the resist film 13 and the underlying portion of the insulator film 12 at which the wafer is to be grounded, for exposing a surface portion of the wafer.

Figure 2B:
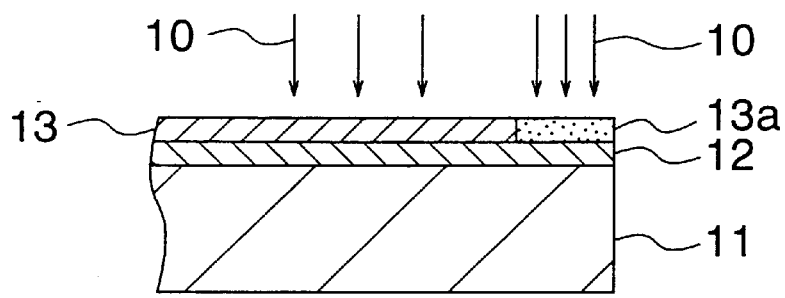

More specifically, the portion 13a of the resist film 13 having an area of about 5 mm×5 mm is subjected to electron beam irradiation together with the other patterning portions of the resist film 13, as shown in FIG. 2B. The intensity of electron beam irradiation for the portion 13a is substantially equal to the intensity of electron beam irradiation for the other area of the resist film 13 for forming contact holes. In this step, the charge-up occurring on the interface between the insulator film 12 and the substrate 11 is so moderate that the charge-up does not cause a substantial problem.

Figure 2C:
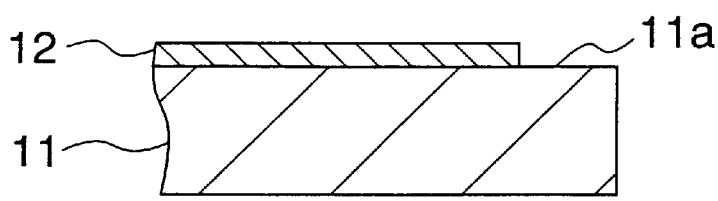
Figure 2D:
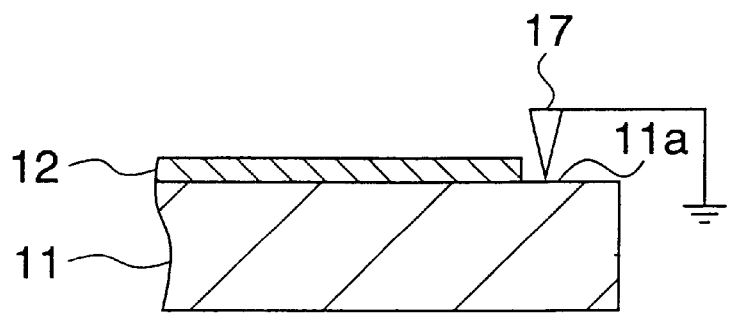

Thereafter, the irradiated portion 13a and other irradiated portions of the resist film 13 are subjected to development for selective removal of the portion 13a and the irradiated portions of the resist film 13. Substantially, the exposed portions of the insulator film 12 from the resist film 13 is removed by an electron beam exposure using the resist film 13 as a mask to form contact holes for the semiconductor substrate and to expose a surface portion 11a of the semiconductor substrate 11, as shown in FIG. 2C. In this state, a grounding pin 17 can be installed on the exposed portion 11a of the substrate 11, as shown in FIG. 2D, so as to achieve an excellent grounding for the next direct writing process. In the present embodiment, since the exposed portion 13a is formed together with the contact holes, the number of process steps does not increase.

Figure 3A:
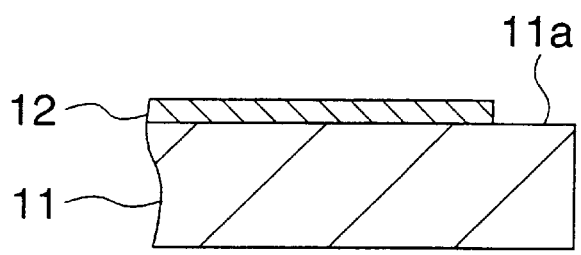
FIGS. 3A to 3E are sectional views of a wafer for showing consecutive steps in a direct writing process therefor according to a second embodiment of the present invention.
Figure 3B:
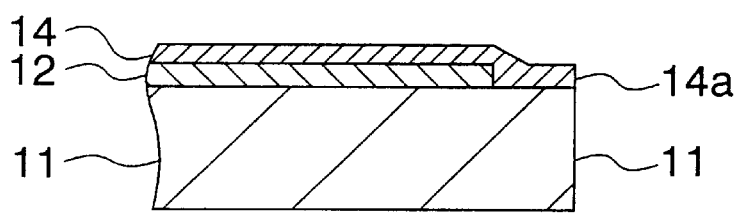
Figure 3C:
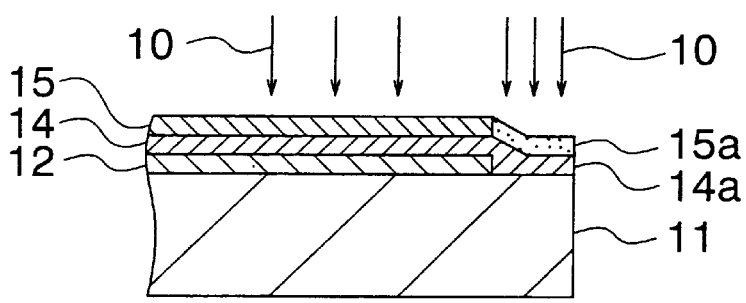

Referring to FIGS. 3A to 3E, there is shown a method according a second embodiment of the present invention. The step shown in FIG. 3A is similar to the step of FIG. 2C, wherein the insulator film 12 is selectively etched for forming contact holes and exposing the portion 11a of the semiconductor substrate 11. After the step of FIG. 3A, aluminum, for example, is deposited on the entire surface of the wafer to form a conductive film 14 having a portion 14a which is in direct contact with the exposed portion 11a of the substrate 11, as shown in FIG. 3B. Subsequently, a negative type liquid resist is applied onto the entire surface of the conductive film 14 to form a negative type resist film 15, followed by irradiation of electron beam 10 onto the negative type resist film 15 for patterning, as shown in FIG. 3C. The electron beam 10 irradiated onto the negative type resist film 15 overlying a conductive film 14 does not cause any charge-up of the interface between the insulator film 12 and the substrate 11 by the electrons. The resultant resist film 15 is subjected to development to leave the irradiated portions of the negative type resist film 15 including the portion 15a on the wafer.

Figure 3D:
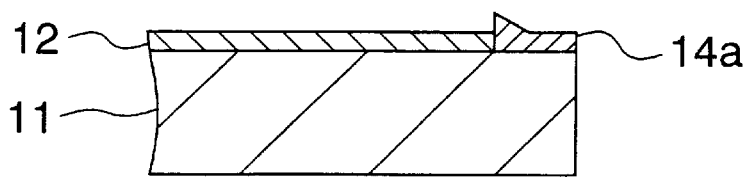
Figure 3E:
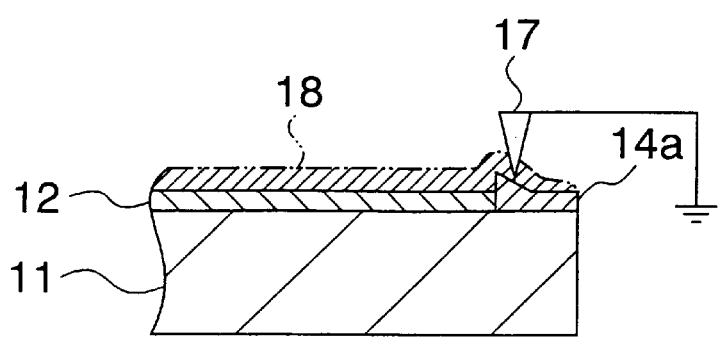

Then, the conductive film 15 is subjected to patterning by selective etching by an electron beam irradiation using the negative type resist film 15 as a mask. The patterning of the conductive film 14 leaves a desired interconnect pattern and a remaining portion 14a of the conductive film 14, as shown in FIG. 3D. In this stage, a grounding pin 17 is installed on the remaining portion 14a of the conductive film 14 to provide an excellent grounding of the substrate 11, as shown in FIG. 3E.

The portion 11a at which the grounding pin 17 is installed has a stepwise profile between the same and the adjacent region in FIG. 3A, which may be considered to cause a defective contact between the grounding pin 17 and the substrate 11 during formation of another insulator film 18. In the present embodiment, however, the stepwise profile is remedied by the remaining portion 14a of the conductive film 14, which provides an excellent contact between the grounding pin 17 and the exposed portion 11a of the substrate. The excellent contact prevents charge-up by electrons during irradiation of the electron beam for patterning the insulator film 18.

In the present embodiment, both the patterning of the insulator film 12 for exposing the portion 11a of the substrate 11 and the patterning of the conductive film 14 for providing an excellent contact between the grounding pin 17 and the substrate 11 can be conducted together with the patterning of the insulator film 12 for the contact holes and the patterning of the conductive film 14 for the interconnect pattern, respectively. As a result, the number of steps for fabrication process of the semiconductor device does not increase thereby.

Since the above embodiments are described only as examples, the present invention is not limited to the above embodiments, and various modifications or alterations can be easily made therefrom by those skilled in the art without departing from the scope of the present invention.

What is claimed is:

1. A method for forming a semiconductor device comprising the steps of:

forming an insulator film on a semiconductor substrate;

patterning said insulator film by irradiating an electron beam to form contact holes in said insulator film, said patterning step exposing a first portion of said semiconductor substrate while also producing a desired pattern over a second portion of said semiconductor substrate; and installing a grounding pin onto said exposed first portion of said semiconductor substrate.

2. The method as defined in claim 1, wherein said insulator film pattern ing step uses a positive type resist film as a mask.

3. A method for forming a semiconductor device, comprising the steps of:

forming an insulator film on a semiconductor substrate;

patterning said insulator film by irradiating an electron beam to form contact holes in said insulator film, said patterning step exposing a first portion of said semiconductor substrate while also producing a desired pattern over a second portion of said semiconductor substrate;

forming a conductive film on said patterned insulator film and said exposed portion of said semiconductor substrate;

patterning said conductive film by irradiating an electron beam to leave an interconnect pattern over said second portion of said semiconductor substrate and also a portion of said conductive film over said first portion of said semiconductor substrate, said portion of said conductive film left by said patterning being in contact with said first portion of said semiconductor substrate; and installing a grounding pin onto said portion of said conductive film in contact with said first portion of said semiconductor substrate.

4. The method as defined in claim 3, wherein said conductive film patterning step uses a negative type resist film as a mask.

* * * * *